United States Patent [19]

Hanlon

[11] 3,989,331

[45] Nov. 2, 1976

[54] DUAL-IN-LINE SOCKET

[75] Inventor: Richard J. Hanlon, Attleboro, Mass.

[73] Assignee: Augat, Inc., Attleboro, Mass.

[22] Filed: Aug. 21, 1974

[21] Appl. No.: 499,217

[52] U.S. Cl. ............................................. 339/17 CF
[51] Int. Cl.² ........................................... H05K 1/12
[58] Field of Search ............ 339/17 R, 17 C, 17 CF, 339/17 L, 275 R, 275 B

[56] References Cited
UNITED STATES PATENTS

| 3,249,910 | 5/1966 | Venn et al. | 339/275 B X |
| 3,584,189 | 6/1971 | Marcoux | 339/17 CF X |
| 3,602,875 | 8/1971 | Pierini | 339/17 CF X |
| 3,717,841 | 4/1973 | Mancini | 339/17 CF |
| 3,732,529 | 5/1973 | Weisenburger | 339/192 R |
| 3,865,455 | 2/1975 | Berg | 339/275 B X |

Primary Examiner—Roy Lake
Assistant Examiner—Craig R. Feinberg
Attorney, Agent, or Firm—Weingarten, Maxham & Schurgin

[57] ABSTRACT

A socket for a dual-in-line electronic package. The socket is plugged into a printed circuit board having dual-in-line arrays of holes therethrough, and an electronic package is removably plugged into the socket. Several alternative means are disclosed to prevent undesired wicking of the solder into the socket contact cavities above the holes in the printed circuit board when the socket is wave soldered to the board.

10 Claims, 7 Drawing Figures

DUAL-IN-LINE SOCKET

FIELD OF THE INVENTION

This invention relates generally to electronic interconnection apparatus and more particularly concerns a socket to receive a dual-in-line electronic package, which socket may be plugged into and wave soldered to a printed circuit board.

DISCUSSION OF THE PRIOR ART

Many sockets for dual-in-line electronic packages have been developed, examples of which are U.S. Pat. Nos. 3,732,529 and Des.210,829. With increased requirements for high density packing in electronic instruments, it is desirable to provide a socket for dual-in-line electronic packages (which may be termed integrated circuit packages or IC's) which permits them to be mounted as closely as possible to the printed circuit board, thereby allowing greater density in mounting such boards within a housing. It is preferable that the socket permit interchangeability of the intergrated circuit packages because in some circumstances it is inappropriate to solder the leads of an integrated circuit package directly to the printed circuit board. It may be appreciated that the closer the integrated circuit package is mounted to the printed circuit board, the greater the likelihood that solder which is used to connect the socket to the board may stray upward through the holes in the board and around the socket contacts mounted in the socket insulator by wicking, which is a form of capillary action. This could prevent the proper functioning of the socket or its contact or both unless special precautions are taken to prevent such an action from occurring.

SUMMARY OF THE INVENTION

This invention comprises an improvement in a low profile dual-in-line integrated circuit package (IC) socket. The socket has contacts mounted therein having resilient fingers at one end which receive the contact leads of the integrated circuit package, the other end of which is an elongated lead which extends through a printed circuit or panel board for electrical interconnection. The insulator of the socket is a molded plastic device having a plurality of cavities opening into one surface, each cavity being configured to receive one of the contacts, and a slot opening into the opposite surface to provide access to the contact fingers by the integrated circuit leads. A downward facing shoulder within the cavity adjacent its opening mates with a step on the contact to provide a positive stop when the contact is mounted to the insulator. The contact is dimensioned to provide an interference fit within the cavity in the insulator for firm mounting therein. A bend or dap in the elongated contact lead provides an interference fit between the lead and the printed circuit (PC) board hole and additionally provides a means to prevent wicking, in many circumstances, of solder beyond the PC board hole up into the cavity between the contact fingers. To ensure that no undesired wicking can occur under any circumstances, a polyester wafer is mounted directly to the underside of the insulator, substantially covering the cavity openings. The wafer has slots which are dimensioned to closely approximate the cross section of the leads of the contacts to thereby hold the wafer in place and prevent solder from flowing up the lead into the space between contact fingers.

Alternatively, in place of the wafer where the dap in the contact lead may not be sufficient to prevent all undesired wicking, a solder barrier strip may be employed on the contact surface. This strip may be made of Teflon (a registered trademark), epoxy or other solder resisting coating such as a metal oxide and should have a width sufficient to prevent its being bridged by the solder when the printed circuit board is wave soldered with the socket mounted thereto.

BRIEF DESCRIPTION OF THE DRAWINGS

The objects, advantages and features of the invention will be readily apparent from the following detailed description when taken in conjunction with the accompanying drawing in which.

DESCRIPTION OF THE PREFERRED EMBODIMENTS

Figure 1:
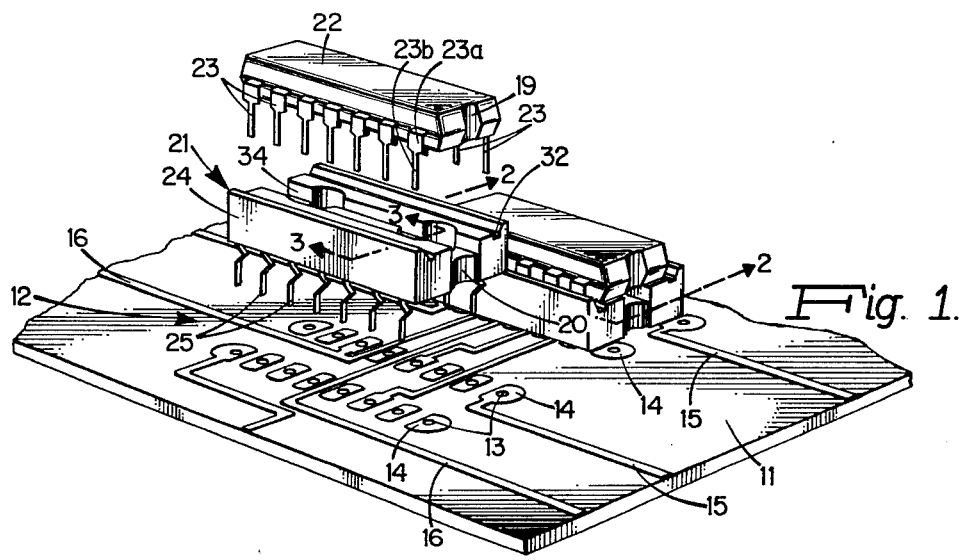
FIG. 1 is a perspective view of a portion of a printed circuit board showing the socket of this invention and a dual-in-line integrated circuit package in both assembled and exploded position.

With reference now to the drawing and more particularly to FIG. 1 thereof, there is shown a printed circuit board 11 having a dual-in-line array 12 of holes 13 through the board, each hole being surrounded by an electrically conductive contact pad 14. Several of the contact pads are electrically connected to conductive paths 15. Other conductive paths are located on the opposite side of the printed circuit board (not shown) while conductive paths 16 in some cases pass between the conductive pads 14 to make contacts elsewhere on the board. A dual-in-line socket 21 constructed in accordance with this invention is adapted to mate with an integrated circuit package 22 having a dual-in-line configuration of leads 23 projecting in two parallel rows from opposite edges thereof. The IC may be seen to comprise a rectangular, normally plastic or ceramic housing enclosing an active solid state electronic component (not shown) which has its various active electrical circuits arranged for external connection through a pair of parallel rows of ribbon like conductive leads 23, each of which extends outwardly from a respective side edge of the housing and is then turned at right angles in the manner shown. Each of the leads 23 includes a relatively wide section 23a which tapers symmetrically to a narrower lead extension 23b. The number of leads is dependent upon the nature of the electrical component contained within the housing, and for illustrative purposes a typical fourteen lead IC has been shown.

The IC also generally includes a polarizing notch or groove 19 to match a similar indentation 20 in insulator 24.

Figure 3:
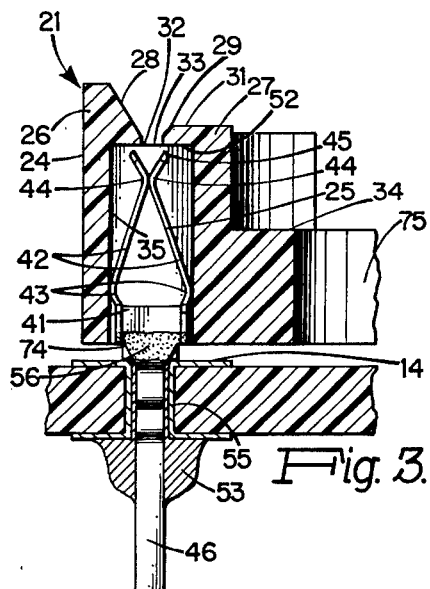
FIG. 3 is an enlarged partial sectional view taken along cutting plane 3—3 of FIG. 1 through one cavity showing the socket contact with an alternative antiwicking embodiment.
Figure 2:
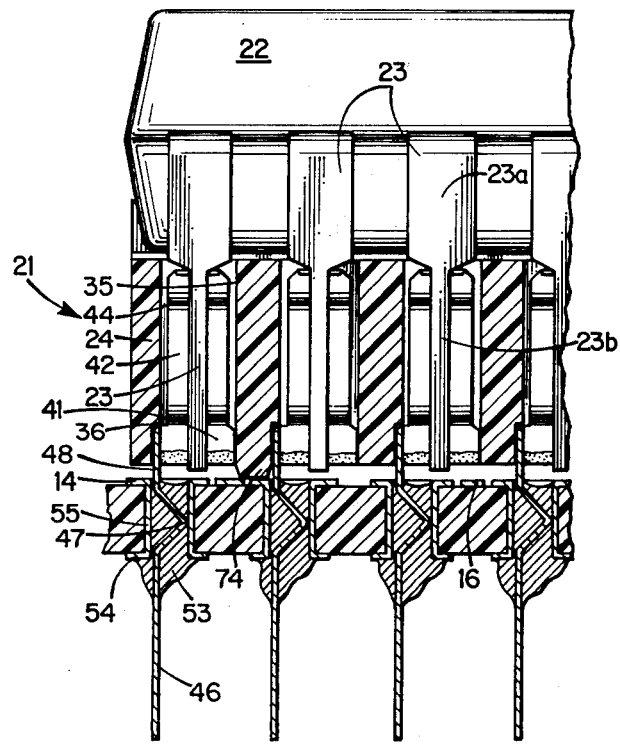
FIG. 2 is an enlarged partial sectional view through the socket and the printed circuit board to which the socket is mounted, taken along cutting plane 2—2 of FIG. 1.
Figure 5:
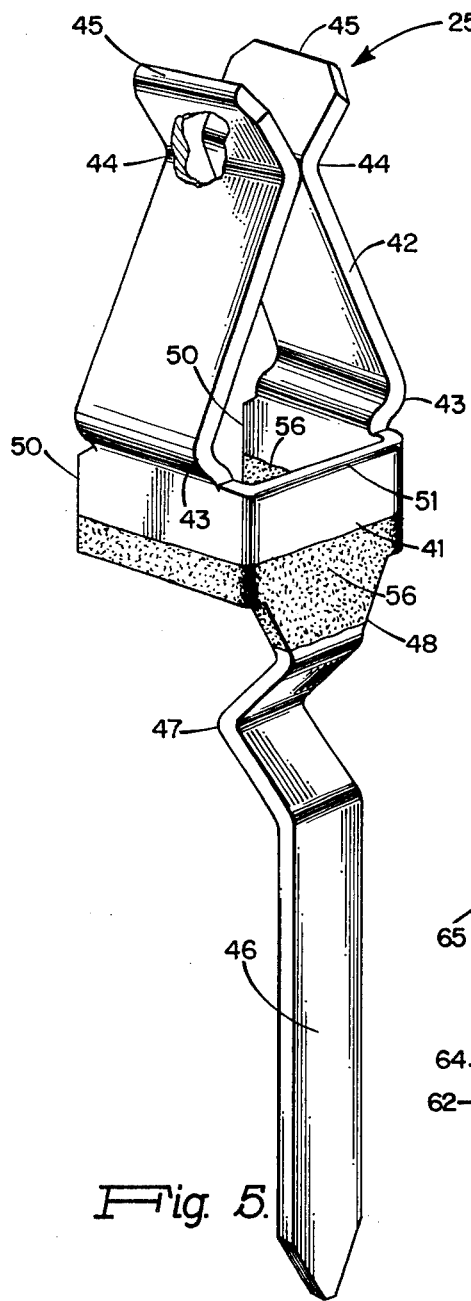
FIG. 5 is a greatly enlarged perspective view of a socket contact formed according to this invention.

With reference now to FIGS. 2, 3, and 5, the socket 21 of this invention is shown in detail. This socket is comprised of an insulator 24 and a plurality of contacts 25. The insulator is an elongated, rectangular device preferably made of plastic or other similar insulating material having sides 26 rising above central portion 27, which central portion provides bearing surfaces 31 upon which rests the integrated circuit package 22 when assembled to the socket. Both sides 26 and central portion 27 taper downwardly with slopes 28 and 29 respectively to intermediate groove 32 in which are located a series of narrow, rectangular openings or slots 33. Since IC's normally are formed with the leads diverging slightly rather than being strictly parallel, the slopes provide a guide for the IC leads to enter slots 33. Furthermore, slots 33 are of sufficient length to permit wide section 23a of the IC leads to enter, thereby ensuring the lowest possible profile since the IC housing will rest upon surfaces 31. The central portion of the insulator includes a recess 34 between bearing surfaces 31 which provides an air cooling channel for the integrated circuit when mounted to the socket, as well as permitting the IC to be grasped more easily by the fingers or a pick-off tool for removal from the socket. The recess is coextensive with the length of the insulator and opens into each end thereof. The insulator is formed with a plurality of cavities arranged in a dual-in-line configuration just inside walls 26 and beneath groove 32. Each cavity opens downwardly to the bottom surface of the insulator and is provided with a shoulder 36 (FIG. 2) on one side within each cavity spaced from and adjacent to the bottom opening thereof and facing toward that opening.

Contact 25 is formed by appropriate metal working operations and includes at least one coining step which will be referred to hereinbelow. The contacts are normally formed from a strip of material and remain attached to the base of the strip by means of the distal end of the contact lead until the contact is mounted within a socket cavity. The contact has a body 41 from which extend upwardly contact fingers 42 which bend initially outwardly from body 41 and then bend toward each other forming knees 43, thence to a reverse bend 44, where the fingers are closely adjacent or touching and then again outwardly so that ends 45 are wider apart than the width of slot 33. Projecting downwardly from body 41 is contact lead 46. The contact lead is bent or dapped at 47. This reverse bend permits the main length of lead 46 to be directly beneath the facing 48 of body portion 41 from which the lead extends.

Contact 25 is mounted to insulator 24 by inserting contact fingers 42 upwardly from the bottom opening of cavity 35 until shoulder 36 is contacted by step 51 which is the top edge of the body portion 41 of the contact from which lead 46 extends. This top edge is rounded, preferably by a coining operation, so that, even with a force fit, it will enter cavity 35 without scraping any of the material of the cavity away but will still maintain a firm stop action when the step contacts shoulder 36. The material of the contacts is preferably beryllium copper which is normally tin plated and is a relatively resilient material so that the contact may be forced into the cavity and the hole in the PC board but will not be permanently deformed while maintaining positive contact. Knees 43 of contact fingers 42 are dimensioned to provide an interference fit with the side walls of cavity 35 and when the contact is inserted into the cavity firm contact is made and maintained therewith. Prior to insertion, the sides of body 41 and consequently fingers 42 diverge toward the open side of the contact body. This has a dual function of facilitating plating of the contact and provides a pre-load for the fingers. When the contact is forced into cavity 35, the fingers become parallel and make tight contact at bends 44 due to the interference fit between knees 43 and the sides of the cavity. This assists in the positive retention of the contact in the cavity but the primary interference fit is between edges 50 and the opposite side of the contact body in the vicinity of step 51. Further, by forcing the fingers tightly together at 44, firm mechanical and electrical contact is made with the IC lead when it is inserted through slot 33 and between fingers 42. Because of the resiliency of contact 25, knees 43 will maintain firm pressure upon the walls of the cavity and firm pressure will be maintained between the contacts at 44. This configuration also permits the contact fingers to accept different size and shape IC leads without permanently setting the fingers in a spread apart position.

The depth of the cavity above shoulder 36 is slightly greater than the height of the contact fingers above step 51 so that there is a clearance between ends 45 of the contact fingers and the inside upper surface 52 of the cavity. This built-in clearance prevents the contacts from being inserted too deeply into the cavity which would jam them against the top of the cavity, preventing their proper resilient functioning. As previously mentioned, the distance between ends 45 of the contact fingers is slightly greater than the width of slot 33. When an integrated circuit package is mounted to socket 21, leads 23 extend downwardly through slots 33 and between contact fingers 42, guided thereto by the sloping sides 28 and 29 into the slots. By insuring that the distance between ends 45 of the contact fingers is greater than the width of slot 33, there is no danger that integrated circuit leads 23 can abut the top edges of the contact fingers nor can they slide behind them. With the structure described above, the contact fingers firmly but resiliently grip leads 23 of the dual-in-line package.

In mounting the assembled socket to the printed circuit board, certain considerations must be taken into account. The board shown in the drawing has contact pads 14 and 54 on either side of holes 13, which pads are electrically interconnected by material 55 lining the hole. These are generally referred to as plated-through holes but this invention is not limited for use with PC boards so configured. When the socket is mounted to the board by inserting leads 46 through holes 13 in an array 12 of dual-in-line holes in the board, the daps 47 in the leads provide a sufficient interference fit to retain the socket in place prior to soldering. Normally the board with several sockets 21 or other components coupled thereto is wave soldered for permanent mounting of these components. A build-up of solder 53 surrounds that portion of lead 46 extending through the board. Due to surface tension and capillary action the solder flows upwardly in the hole 13 and may continue up along the contact surface into cavity 35 where it could partially fill the cavity and make the resilient fingers inoperative for their intended function. Furthermore, if any solder enters the cavity, it would prevent the IC from being seated properly in the socket because IC leads 23 would not be able to extend fully between contact fingers 42 through the cavity as shown in FIG. 2. This undesired solder flow will be referred to as wicking and means to prevent it are disclosed herein.

Under certain conditions, wicking may be prevented by dap 47 in lead 46. This mechanical interruption of solder flow permits full electrical contact within hole 13 but continued upward flow is disrupted so that the cavity and contact fingers remain free of solder.

Figure 4:
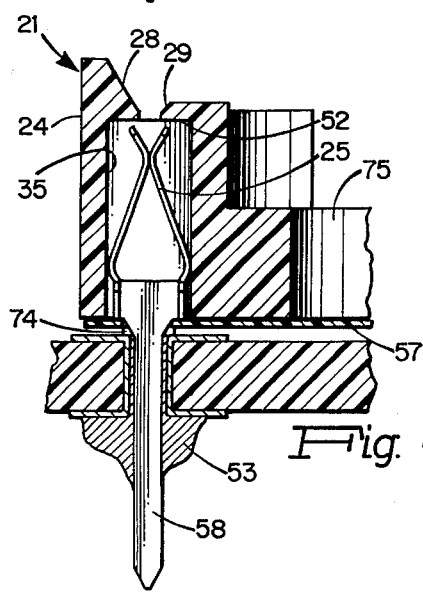
FIG. 4 shows a preferred embodiment to prevent wicking in a view similar to that of FIG. 3.

A preferred anti-wicking feature is shown in FIG. 4. The contact lead 58 may be straight as shown in this figure or it may include the dap previously described. With the straight lead, holes 13 in the PC board may be smaller, thereby facilitating the application of conductive traces 16 between contact pads 14. A polyester wafer 57 having substantially the same surface dimensions as the bottom of insulator 24 is fitted over leads 58 to reside between the socket and printed circuit board 11 closely against the insulator. This is an effective barrier and there is insufficient space through a slot in the wafer and around the lead for solder to flow into a cavity. The wafer is held in place by frictional engagement with the contact leads. While a polyester is mentioned as the material for wafer 57, it could be anything which is dimensionally stable and can withstand solder temperatures.

Another advantage afforded wafer 57 is that it prevents electrical shorting of IC leads to printed circuit paths 16 which pass between contact pads 14. With reference to FIG. 2 it may be seen that leads 23 are not directly above the printed circuit board holes 13 because contact leads 46 extend downwardly from one side of the contact and occupy the PC board holes. This offsets the cavities in insulator 24 with respect to holes 13 in the PC board. Due to normal tolerances in the socket and IC industries, it is possible for the leads of an IC to extend downwardly sufficiently far to contact the top of the PC board. With conductive paths passing between pads 14, contact could be made between the IC leads and such paths. Insulative wafer 57 prevents such shorting from occurring by physically preventing the IC leads from passing beyond the wafer.

An alternative to prevent wicking of the solder into the cavity in the socket is shown in FIGS. 3 and 5. A stripe 56 of Teflon, epoxy or other suitable solder resisting material on the upper surface of lead 46 above dap 47 and on the bottom portion of contact body 41 is applied by suitable means such as by painting or electro-deposition on a strip of tin plated beryllium copper before contacts 25 are formed. Stripe 56 is sufficiently wide to prevent the solder from bridging it, thereby arresting its upward flow at the desired point at the top of plated-through hole 13.

It may be noted that normally the IC lead will not extend sufficiently beyond the end of cavity 35 to touch the top of the PC board. This is due to standoffs 74, shown in FIGS. 2–4 and 6. These standoffs maintain the insulator body in a spaced position with respect to the top surface of the PC board. Where wafer 57 is employed, it will have holes therethrough to accommodate the standoffs, thereby permitting the wafer to fit against the bottom surface of the insulator. This also permits ready cleaning of the top of the board after assembly and soldering.

Figure 6:
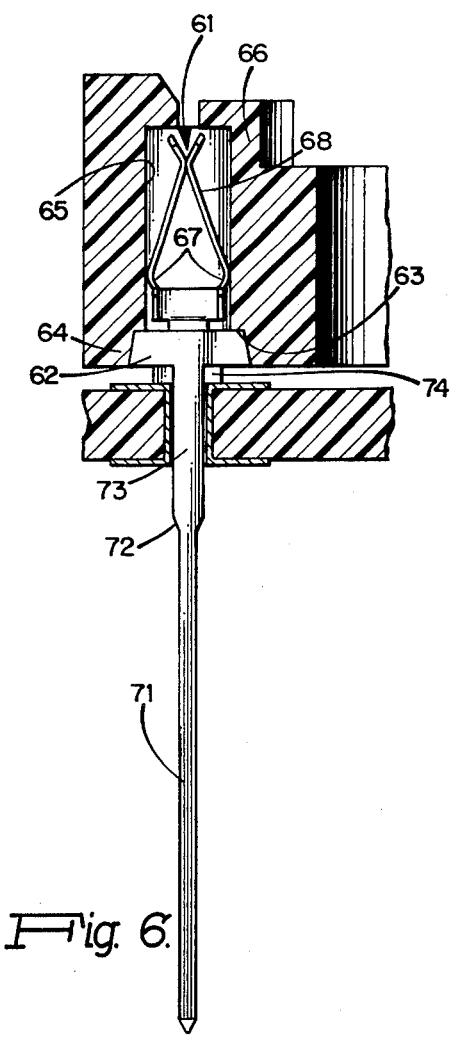
FIG. 6 is a view similar to FIG. 3 showing a socket contact with a wire wrapping configuration.
Figure 7:
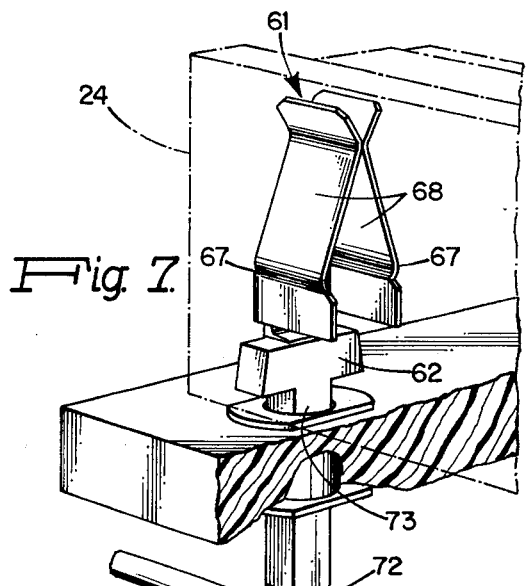
FIG. 7 is a greatly enlarged perspective view of the wire wrapping pin contact of FIG. 6 in situ.

The socket configured for wire wrapping purposes is shown in FIGS. 6 and 7. The contact 61 is made the same way as contact 25 but the material is somewhat thicker at the outset. The top part of the strip of contact material is then made thinner by appropriate machining or contouring operations for formation of the contact fingers along that edge of the strip. As seen in the drawing, the body 62 of the contact is formed as a T. The two wings of this T 62 fit within slots 63 and 64 extending laterally from the bottom of cavity 65 in insulator 66 and opening outwardly from the bottom surface of the insulator. The wings of the T are fully seated within the slots and knees 67 of contact fingers 68 perform the same function as knees 43 of contacts 25. Note that the wings of the T taper outwardly toward pin 71 to permit easy entry into slots 63, 64, but provide an interference fit when fully seated. Wire wrapping pin 71 extends downwardly from body 62, tapering at 72 to a somewhat smaller cross section from that portion 73 extending through hole 13 in printed circuit board 11. The larger portion 73 of the pin is force fitted into the PC board hole for positive electrical and mechanical contact. This adds strength and rigidity to the pins which are relatively thin. The hole 13 is plated through and has conductive pads on either side as previously discussed, so that the corners of the pin 71 bite into the hole plating, appropriate contact is made and solder is not necessary, although it may be used if desired.

The insulator shown in the drawing is provided with mounting holes 75 so that screws or bolts may be used for special applications in addition to or in place of a force fit of the contact leads in the PC board or soldering. For reference purposes, the insulator of the FIG. 1 embodiment would be 0.695 inch long, 0.395 inch wide and 0.188 inch high for a fourteen contact socket. The width and height will remain the same for IC's having similar configuration with a different number of contacts. Relatively minor dimensional modifications are made for the socket of FIG. 6 used in the wire wrapping configuration. Other modifications and improvements will likely occur to those skilled in this art which are within the scope of this invention.

What is claimed is:

1. A socket for removably receiving a dual-in-line electronic package and for mounting to a dual-in-line array of holes in a printed circuit board, said electronic package including a generally flat rectangular housing with two substantially parallel rows of conductive leads respectively extending outwardly from a pair of opposite parallel edges of said housing and turned at substantially right angles to the flat surface of said housing to protrude beyond one flat surface thereof, said leads tapering symmetrically to a reduced width at their respective ends, said socket comprising:

a unitary generally flat rectangular insulator having raised parallel sides along two opposite edges at the top, a central portion with flat bearing surfaces between said parallel sides said parallel sides extending above said bearing surfaces, a plurality of cavities opening into the bottom surface of said insulator, each said cavity having substantially the same cross section from its bottom opening to a point adjacent and spaced from said bearing surfaces, said cavities being arranged in parallel rows adjacent said parallel sides, each of said cavities having a downward facing shoulder along one internal side thereof spaced from said bottom opening, and a plurality of slots through said central portion adjacent said parallel sides and said bearing surfaces, each slot opening into one of said cavities; and a plurality of contacts, one of said contacts being mounted in each cavity, each of said contacts being formed with a body portion having an upward facing step adapted to abut said shoulder within said cavity thereby forming a positive stop when said contact is mounted within said cavity, said body portion being in an interference fit within the bottom of said cavity, a pair of resilient figures extending upwardly from said body portion into said cavity and positioned beneath said slot, and an elongated lead extending downwardly from said body portion, said fingers of said contact bending outwardly immediately above said body to form oppositely facing knees, and then bending inwardly to a point of normally spaced confronting relationship when outside of said cavity, then bending outwardly at the upper ends to form a tapered opening therebetween wider than the width of said slots, the distance between said knees of said contact being normally greater than the width of said cavity, said knees being forced toward each other by the opposite walls of said cavity engaging said knees when said contact is mounted therein, thereby forcing said fingers toward each other and in a preloaded resiliently contacting relationship at said normally spaced points, the length of said cavity from said shoulder to said point adjacent said bearing surfaces being greater than the length of said fingers above said upward facing step.

2. The socket recited in claim 1 wherein said elongated lead has a reverse bend therein adjacent said body portion and below said bottom surface of said insulator, said lead extending downwardly in substantially the same plane as the body portion surface to which it is attached, said reverse bend of said lead being adapted to form an interference fit within a hole in said printed circuit board when said socket is mounted thereto.

3. The socket recited in claim 1 and further comprising a solder resisting coating on said contact on the bottom part of said body portion and the upper part of said lead to form a continuous solder barrier.

4. The socket recited in claim 1 and further comprising a flat unitary insulative wafer mounted to the bottom of said insulator and covering the cavity openings therein, said wafer having a shape substantially the same as the bottom surface of said insulator and having a plurality of slots therethrough of substantially the same cross section as said contact leads and being arranged in dual-in-line configuration to accommodate said contact leads extending downwardly from said insulator and through said wafer, said wafer preventing solder flow into said cavities and preventing a lead of said dual-in-line electronic package from making electrical contact with the top of said printed circuit board when said dual-in-line electronic package is mounted to said socket and said socket is mounted to said printed circuit board.

5. The socket recited in claim 1 wherein said insulator includes a plurality of integral projections extending from said bottom surface thereof, said projections being substantially shorter than said elongated contact leads, said projections being adapted to abut the surface of said printed circuit board when said socket is mounted thereto, thereby spacing said bottom surface from the surface of said printed circuit board.

6. The socket recited in claim 1 wherein said upward facing step of said contact is rounded to facilitate force fit entry into said cavity.

7. The socket recited in claim 1 wherein said slots in said insulator are located in a longitudinal groove between said parallel sides and said bearing surfaces and is depressed from said bearing surfaces, said parallel sides and said bearing surfaces sloping downwardly to said groove.

8. The socket recited in claim 7 wherein said insulator has a depressed longitudinal central portion opening through either opposite end thereof to provide free air circulation around said dual-in-line electronic package when resting on said bearing surfaces.

9. The socket recited in claim 1 wherein said contact body portion is formed as a T, said insulator having lateral slots extending laterally from said cavity adjacent said opening to accommodate the lateral T projections of said contact.

10. The socket recited in claim 9 wherein said lateral T projections of said contact are sloped longitudinally outwardly away from said contact fingers to facilitate force fit entry into said lateral slots in said insulator and to provide a positive retentive interference fit therewith.

* * * * *